United States Patent [19]

Weinberger et al.

[11] Patent Number: 4,608,097
[45] Date of Patent: Aug. 26, 1986

[54] METHOD FOR PRODUCING AN ELECTRONICALLY PASSIVATED SURFACE ON CRYSTALLINE SILICON USING A FLUORINATION TREATMENT AND AN ORGANIC OVERLAYER

[75] Inventors: Bernard R. Weinberger, Plainsboro; Harry W. Deckman, Clinton; Eli Yablonovitch, Scotch Plains, all of N.J.

[73] Assignee: Exxon Research and Engineering Co., Florham Park, N.J.

[21] Appl. No.: 658,357

[22] Filed: Oct. 5, 1984

[51] Int. Cl.⁴ .................. H01L 21/02; H01L 21/48
[52] U.S. Cl. .................. 148/33.3; 148/DIG. 17; 29/590; 357/52; 427/82; 427/155; 427/255.6
[58] Field of Search ........ 29/590; 148/33.3, DIG. 17, 148/DIG. 22, DIG. 57, DIG. 130; 357/52; 427/155, 255.6, 443.2, 82, 385, 122; 428/451, 500, 524, 538

[56] References Cited

U.S. PATENT DOCUMENTS

| | | | |
|---|---|---|---|
| 2,875,384 | 2/1959 | Wallmark | 357/52 X |
| 2,899,344 | 8/1959 | Atalla et al. | 148/33.3 |
| 2,930,722 | 3/1960 | Ligenza | 148/33.3 |
| 2,935,781 | 5/1960 | Heidenreich | 357/52 X |
| 2,948,642 | 8/1960 | MacDonald | 148/33.3 |
| 2,953,486 | 9/1960 | Atalla | 357/52 X |
| 3,309,760 | 3/1967 | Reznick et al. | 357/52 X |
| 4,030,948 | 6/1977 | Berger | 148/33.3 |
| 4,040,874 | 8/1977 | Yerman | 148/33.3 |
| 4,317,086 | 2/1982 | Scifres et al. | 352/52 X |

OTHER PUBLICATIONS

Thin Solid Films, 13 (1972) pp. 33-39, by J. Tanguy.
Insulating Films on Semiconductors, Proceedings of the Second International Conference, INFOS 81, Erlangen, Fed. Rep. of Ger., Apr. 27-29, 1981, by G. G. Roberts.

*Primary Examiner*—Brian E. Hearn
*Assistant Examiner*—David A. Hey
*Attorney, Agent, or Firm*—Ronald D. Hantman

[57] ABSTRACT

A method is described for producing an electronically passivated stable surface on silicon wafers. The passivation technique consists of first fluorinating the surface of a crystalline silicon wafer under inert atmospheric conditions. Such a treatment may consist of either a vapor phase or liquid phase application of HF at room temperature. The surface fluorinated wafer is then maintained in an inert atmosphere and a thin coating of an organic solid is applied to the wafer which does not disturb the underlying passivated silicon surface. The wafer may then be further processed into a variety of different devices.

15 Claims, 7 Drawing Figures

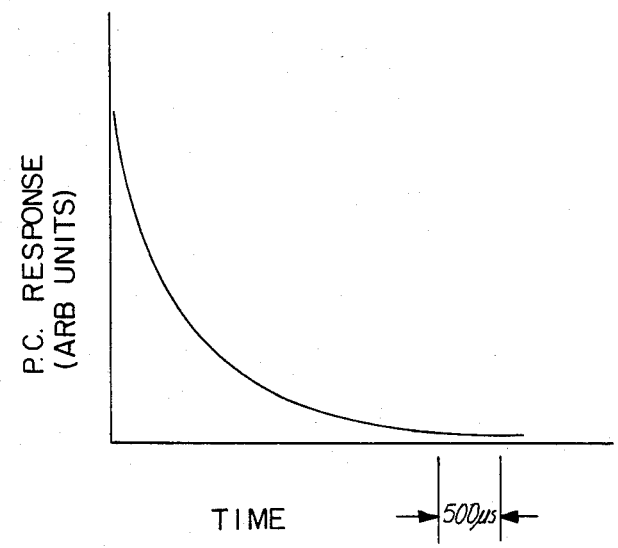
F I G. 1a
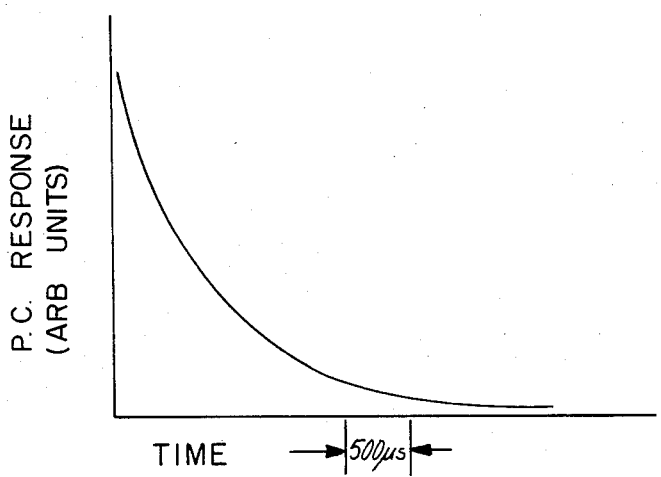
F I G. 1b

METHOD FOR PRODUCING AN ELECTRONICALLY PASSIVATED SURFACE ON CRYSTALLINE SILICON USING A FLUORINATION TREATMENT AND AN ORGANIC OVERLAYER

BACKGROUND OF THE INVENTION

This invention relates to passivating the surface of silicon.

It is well known that the termination of a semiconductor lattice at the surface of a wafer results in an electronic configuration at the surface drastically different from that found within the bulk of the semiconductor. Situations such as distorted bonds or unsatisfied dangling bonds at the surface create electronic states within the semiconductor's forbidden energy gap. Such electronic states are localized and therefore can trap and immobilize charge and thereby degrade the performance of the device. For example: in field effect transistors (FET's) the storage of charge in surface states increases the gate capacitance, adversely affecting the high frequency response of such devices. Since such stored charge is immobile it does not contribute to current flow in the FET channel reducing the device transconductance. In photovoltaic devices, such surface states act as recombination centers for photogenerated electrons and holes reducing the output current and voltage delivered by such devices and thereby limiting their energy conversion efficiencies.

In conventional semiconductor device technology, crystalline silicon remains the dominant material out of which active devices are fabricated. A crucial property of silicon which has to a great measure been responsible for its technological importance is the existence of its oxide ($SiO_2$) which when carefully grown on the surface of a water forms an excellent surface passivation layer nearly eliminating all surface states at the silicon—$SiO_2$ interface. Surface state densities may be as low as $10^{10}/cm^2$ (approximately $1/10^5$ surface atoms). The preparation of such well passivated oxidized silicon surfaces is difficult. It requires the proper preoxidation cleaning and etching followed by a high temperature (greater than 1000° C.) oxidation step, see e.g. M. M. Atalla, E. Tannenbaum, and E. J. Scheibner, Bell. Sys. Tech. J., 749 (May, 1959). As well as being a costly energy consuming process high temperature oxidation of silicon is susceptible to the degradation of the silicon wafer due to the mobility of dopants and impurities at such elevated temperatures.

Non-oxidative surface treatments of silicon have been attempted involving treatment with a variety of etchants, see, e.g., T. M. Buck and F. S. McKim, J. Electrochem. Soc. 105, 709 (1958). However, such passivations were found to be inferior to thermally grown oxides and subject to degradation in room atmosphere.

Accordingly, it would be highly desirable to overcome the problems associated with the high temperature oxidation process and produce a passivated silicon surface whose surface state density was as low as that for thermally oxidized surfaces. Such a process should be a simple low temperature process and produce a passivated surface stable under atmospheric conditions.

SUMMARY OF THE INVENTION

The present invention is a method for producing an electronically passivated surface on silicon which includes the steps of fluorinating said surface by terminating the silicon surface with fluorine bonds, maintaining said surface in an inert atmosphere, and coating said surface with an air impermeable diffusion barrier.

BRIEF DESCRIPTION OF THE DRAWINGS

FIG. 1a shows the photoconductive decay of a 250μ thick crystalline silicon wafer subsequent to immersion of the wafer in aqueous HF and coating with a thin tetracene film.

FIG. 1b shows the photoconductive decay of a 250μ thick crystalline silicon wafer subsequent to immersion in aqueous HF, coating with a thin rubrene film, and overcoating with a thin $MgF_2$ film, as measured in air.

FIG. 2a shows the apparatus employed to treat and passivate crystalline silicon wafers according to the present invention.

FIG. 2b shows an alternative to a portion of the apparatus of FIG. 2a.

DETAILED DESCRIPTION OF THE INVENTION

This invention provides a technique for producing on crystalline silicon stable electronically passivated surfaces. Said wafers may then be processed into a variety of active semiconductor devices. By electronically passivated we mean that the surfaces of the wafers have a very low density of surface electronic states whose energies are within the forbidden energy gap of the bulk silicon. We have monitored the effectiveness of our passivation technique by measuring the photoconductive lifetime of injected charge in wafers treated in accordance with our invention, see, e.g., T. Tiedje, J. I. Haberman, R. W. Francis, and A. K. Ghosh, J. Appl. Phys. 54, 2499 (1983). Such lifetimes may be directly related to the density of surface states, $$\tau\text{surf} = L/2\sigma v_{th} N_{st},$$

where $\tau$ surf is the photoconductive lifetime of injected carriers due to a surface density of states $N_{st}$ on a wafer of thickness L. $\sigma$ is the charge capture cross section for these states (typically $10^{-15} cm^2$) $v_{th}$ is a thermal velocity ($10^7$ cm/s). FIGS. 1a and b show photoconductive decay curves for a 250μ thick crystalline silicon wafers treated in accordance with our invention. They indicate a photoconductive lifetimes of 900 μs which implies from the above formula a surface density of states of $1.4 \times 10^9$ states/$cm^2$ which is equivalent to the density obtained using the best thermal oxides.

Figures 2A, 2B:
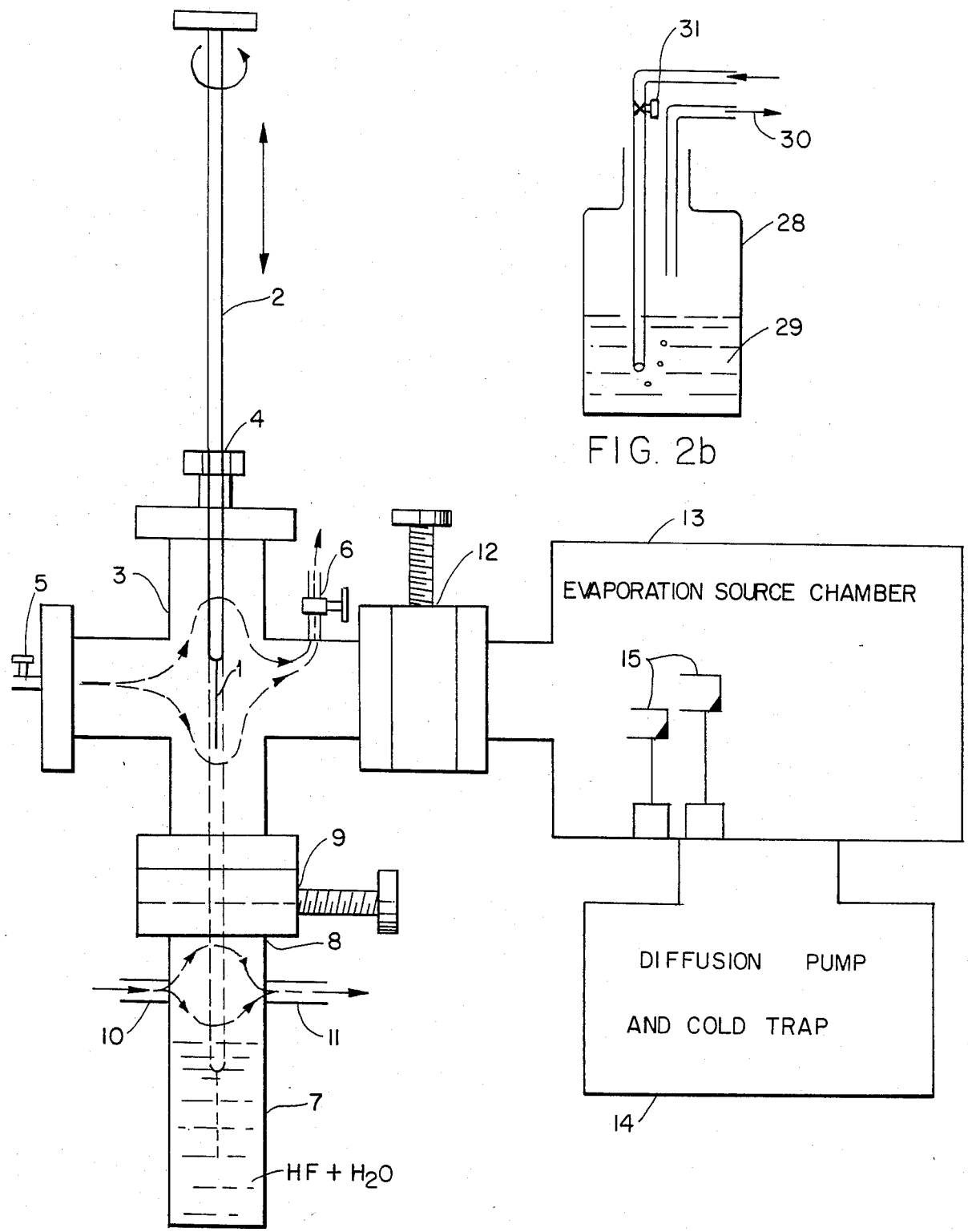

FIG. 2a shows the apparatus employed to treat and passivate crystalline silicon wafers according to the present invention. The wafer 1 is first degreased in an ultrasonic cleaner and mounted on a teflon rod 2 in our treatment chamber 3. The chamber 3 is a stainless steel cross with six vacuum flanges. Two of the flanges, one into the page and the other out of the page, are not shown in FIG. 2. One contains electrical feed throughs leading to a coil which is inductively coupled to the silicon wafer 1. The second flange has a quartz window. These flanges permit direct monitoring of the effects of the treatment and coating procedures described in the present invention via an in situ measurement of the photoconductive lifetime without removing the wafer from the inert atmosphere of the cross, see T. Tiedje, J. Haberman, R. W. Francis, and A. K. Ghosh, J. Appl. Phys. 54, 2499 (1983). The interior of the cross is coated with teflon. The sample rod passes through a vacuum seal which permits both rotary and up and down translation of the rod so that the sample may be manipulated in the chamber. The treatment chamber is flushed through valves 5 and 6 with an inert gas such as Ar or He to remove all air from the chamber. A teflon chamber 7 partially filled with a 49% aqueous solution of HF is suspended below the treatment chamber with an air tight compression seal 8. The HF chamber 7 is separated from the treatment chamber with a gate valve 9. The HF chamber is also flushed with inert gas to eliminate air from this chamber as well through ports 10 and 11.

When all the air has been flushed from chambers 3 and 7 gate valve 9 is opened and the wafer 1 is lowered until it is completely immersed in the hydrofluoric acid (shown as dotted line in FIG. 2a). It remains immersed for a period of time from 30s to 60s. It is then withdrawn from the acid back into the upper chamber 3 and gate valve 9 is sealed closed. The immersion in the HF has fluorinated the surface by the removal of the native oxide from the wafer surfaces and the termination of the surfaces with fluorine bonds, see, e.g., G. B. Larabee, K. G. Heinen, S. A. Harrel, J. Electrochem. Soc. 114, 867 (1967). The surfaces so treated are well passiviated as indicated by long photoconductive lifetimes, see FIG. 1. The use of HF allows the removal of the native oxide and the termination of the silicon surface with one step. Other sources of fluorine may require a separate etching step for the removal of the oxide. Other sources of fluorine include $XeF_2$ and fluorine plasmas.

An alternate technique has also been successfully employed to treat the surface of silicon wafers with hydrofluoric acid. It is shown in FIG. 2b. Instead of immersing the wafer directly in aqueous HF in the teflon chamber 7, the wafer is exposed only to $HF+H_2O$ vapor. This is accomplished by bubbling an inert carrier gas (argon) through valve 31 into a polypropylene bottle 28 containing a 49% aqueous HF solution 29. The exit stream of gas $(Ar+HF+H_2O)$ 30 is introduced into the treatment chamber through valve 5 and exits through valve 6. We have obtained high photoconductive lifetimes on silicon wafers subject to this HF vapor treatment, lifetimes equivalent to that obtained with the immersion technique.

The wafers are now ready for further processing. A crucial aspect of our technique is that all passivation steps are performed in an inert atmosphere. The measured lifetime of the fluorinated surface rapidly degrades upon exposure to air. The next step in processing requires the deposition of a protective overlayer to protect the passivated surface from air degradation. The requirements for this overlayer are: it must be an effective barrier preventing air from reaching the passivated surfaces; it must be chemically inert, not disturbing the fluorinated surface; it must be simple to deposit by low temperature processes.

It has been discovered that one such overlayer involves first the deposition of a thin film of a polynuclear aromatic organic solid by thermal evaporation onto the wafer held at room temperature. The procedure employed is as follows. Subsequent to the HF immersion step described above, the treatment chamber 3 is evacuated by opening the gate valve connecting it to the evaporation source chamber 13 which is pumped to pressures of $2\times10^{-6}$ torr by the diffusion pump 14. It has been found by monitoring the photoconductive lifetime with the inductively coupled contactless technique, see e.g., T. Tiedje, J. I. Haberman, R. W. Francis, and A. K. Ghosh, J. Appl. Phys. 54, 2499 (1983), that such a pumpout step does not degrade the lifetime of the passivated wafer. The thermal evaporation sources 15 are then used to coat the wafer. Both sides of the wafer may be so coated by rotating the sample rod 2. Examples of polynuclear aromatic organic solids we have employed as overlayers are tetracene (2,3 benzanthracene) and rubrene (tetraphenyl napthacene). FIG. 1a shows the photoconductive decay of a $250\mu$ thick crystalline silicon wafer subsequent to immersion of the wafer in aqueous HF and coating with a thin tetracene film. A key property of the organic film is that it isolates the passivated fluorinated surface from subsequent overlayers. For example, we have coated an HF immersed wafer with a $MgF_2$ overlayer. The overlayer of $MgF_2$ was also deposited from a thermal evaporation source 15. When the $MgF_2$ was evaporated directly onto the fluorinated surface a severe degradation of the photoconductive lifetime was observed. However, when a thin film of rubrene was deposited prior to the $MgF_2$ deposition a long lifetime was maintained. Such an overlayer of $MgF_2$ can serve an important function. It provides an air impermeable diffusion barrier superior to that of the organic alone preventing degradation of the surface passivation when the wafer is brought into atmospheric air. Other diffusion barriers include insulators and conductors such as metals. FIG. 1b shows the photoconductive decay of a $250\mu$ thick crystalline silicon wafer coated with rubrene and $MgF_2$ *as measured in air*. The measured photoconductive lifetime implies a surface passivation resulting in on the order of one electrically active surface state per $10^5$ surface atoms, even after exposure to air.

Figure 3A:
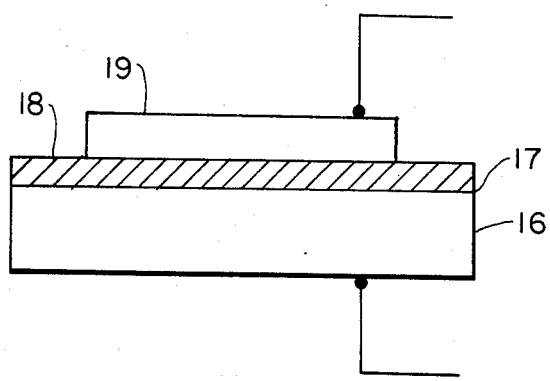
FIGS. 3a-3c shows three generic semiconductor devices which may advantageously employ the present invention for passivation of the surface of crystalline silicon.

FIG. 3 shows three generic semiconductor devices which may advantageously employ the present invention for passivation of the surface of crystalline silicon. FIG. 3a shows a generic metal insulator semiconductor (MIS) device which consists of a substrate of crystalline silicon 16 an HF passivated surface 17, a thin organic overlayer 18, and a metal top contact 19. Such devices may be employed as photovoltaic devices, voltage variable capacitors, or in arrays as charge storage devices (CCD). In each application optimal performance depends upon a well passivated surface. The device portrayed in FIG. 3A takes advantage also of the high electrical resistivity of the polynuclear aromatic organic film which serves as the insulator in the MIS structure.

Figure 3B:
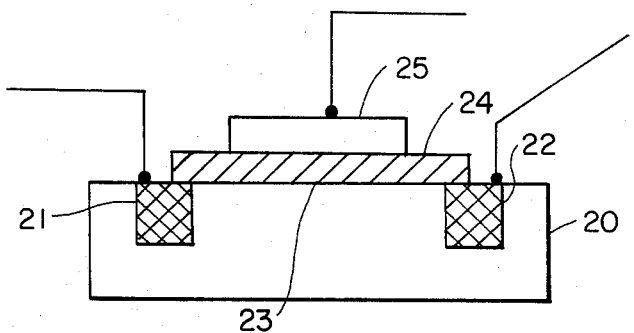

FIG. 3b shows a generic metal insulator semiconductor field effect transistor (MISFET). It consists of a crystalline silicon substrate (either n or p type) diffused source 21 and drain 22 contacts of opposite conductivity type to the base (n or p), a passivated surface 23 on which a thin polynuclear aromatic organic insulating film 24 is deposited and a metallic gate electrode 25.

Figure 3C:
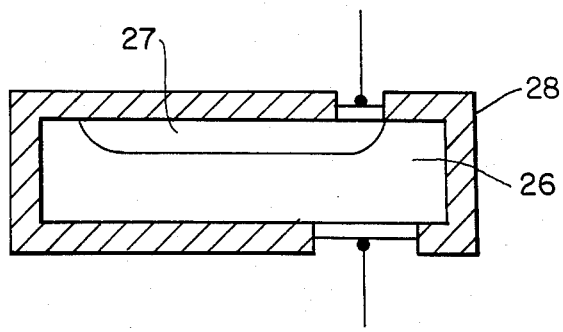

FIG. 3c shows a generic p-n diffused junction device which may be operated as a photovoltaic cell. It consists of a base 26 crystalline silicon wafer of one conductivity type (either p or n) in which a junction 27 with the opposite type conductivity has been diffused. The passivation of the surfaces of this device may be accomplished according to this invention by only low temperature steps: HF immersion and organic thin film 28 deposition onto the device held at room temperature.

As the passivation steps are performed with the device at room temperature the doping profile established by the diffusion process is not disturbed.

What is claimed is:

1. A method for producing an electronically passivated surface on silicon comprising:
   a. surrounding said surface with an inert atmosphere,
   b. exposing said surface to a fluorine containing compound,
   c. maintaining said surface in an inert atmosphere, and
   d. coating said surface with an air impermeable diffusion barrier in order to prevent degradation of said passivated surface.

2. The method of claim 1 wherein said exposing step is carried out by removing the native oxide layer and reacting the exposed surface with a source of fluorine.

3. The method of claim 1 wherein said exposing step is carried out in one step.

4. The method of claim 2 wherein said source of fluorine is HF, $XeF_2$ or a fluorine plasma.

5. The method of claim 4 wherein said exposing step is performed by immersing said silicon surface into an aqueous solution of HF.

6. Th method of claim 4 wherein said exposing step is performed by contacting said silicon surface with a vapor including HF.

7. The method of claim 1 wherein said maintaining step is performed by keeping said surface in a vacuum.

8. The method of claim 1 wherein said maintaining step is performed by keeping said surface in an inert atmosphere of an inert gas.

9. The method of claim 1 wherein said coating step is performed in which said diffusion barrier is an organic material.

10. The method of claim 9 wherein said organic material is tetracene.

11. The method of claim 9 wherein said organic material is rubrene.

12. The method of claim 9 wherein said diffusion barrier further comprises a layer of insulator material adjacent to said organic material.

13. The method of claim 9 wherein said diffusion barrier further comprises a layer of conductor material adjacent to said organic material.

14. The method of claim 12 wherein said insulator is $MgF_2$.

15. The method of claim 13 wherein said conductor is any metal.

* * * * *